United States Patent [19]

Suga et al.

[11] Patent Number: 5,153,703
[45] Date of Patent: Oct. 6, 1992

[54] SEMICONDUCTOR DEVICE

[75] Inventors: Toru Suga, Tokyo; Kazuhiko Inoue, Yokohama, both of Japan

[73] Assignee: Kabushiki Kaisha Toshiba, Kawasaki, Japan

[21] Appl. No.: 704,838

[22] Filed: May 20, 1991

Related U.S. Application Data

[63] Continuation of Ser. No. 556,880, Jul. 23, 1990, abandoned, which is a continuation of Ser. No. 322,333, Mar. 10, 1989, abandoned.

[30] Foreign Application Priority Data

Mar. 14, 1988 [JP] Japan .................. 63-59909

[51] Int. Cl.$^5$ ............... H01L 29/167; H01L 29/80; H01L 29/20
[52] U.S. Cl. ............................ 357/63; 357/64; 357/22; 357/23.2
[58] Field of Search .................. 357/63, 64, 22, 23.2

[56] References Cited

U.S. PATENT DOCUMENTS

| | | | |
|---|---|---|---|
| 4,602,965 | 7/1986 | McNally | 357/91 |
| 4,670,176 | 6/1987 | Morioka et al. | 357/63 |
| 4,905,061 | 2/1990 | Ohmuro et al. | 357/91 |

FOREIGN PATENT DOCUMENTS 60-54479  3/1985  Japan .................. 357/64

OTHER PUBLICATIONS

"IEEE Transaction on Electron Devices", vol. ED-34, No. 6, Jun. 1987, pp. 1239-1244.

*Primary Examiner*—Mark V. Prenty
*Attorney, Agent, or Firm*—Finnegan, Henderson, Farabow, Garrett and Dunner

[57]  ABSTRACT

In a semiconductor device constituting a GaAs MESFET, a GaAs substrate is prepared from a base material containing boron and carbon ions as impurities having a total impurity concentration of $2 \times 10^{17}$ atoms/cm$^3$ or more. Electrode layers are formed at predetermined portions on the GaAs substrate, and an active layer is formed to be adjacent to the electrode layers by ion implantation. Source and drain electrodes are formed on the electrode layers, respectively, and a gate electrode is formed on the active layer.

2 Claims, 1 Drawing Sheet

SEMICONDUCTOR DEVICE

This application is a continuation of now abandoned application Ser. No. 07/556,880 filed Jul. 23, 1990, which in turn is a continuation of now abandoned application Ser. No. 07/322,333, filed Mar. 10, 1989.

BACKGROUND OF THE INVENTION

1. Field of the Invention

The present invention relates to an improvement of a semiconductor device constituting a GaAs MESFET.

2. Description of the Related Art

Conventionally, Cr-doped semi-insulating GaAs or non-doped LEC (Liquid Encapsulated Czochralski) GaAs has been used as base material of a GaAs Metal-Semiconductor Field-Effect-Transistor (to be referred to as a GaAs MESFET hereinafter). In order to form a GaAs MESFET from this base material, the following manufacturing steps are conventionally required.

When a non-doped LEC GaAs substrate is used as a base material, a proper pretreatment is performed for the substrate. Thereafter, an SiOx layer having a thickness of, e.g., 5,000 Å is deposited on the substrate by chemical vapor deposition. Openings are formed on desired portions of the substrate through the SiOx layer using a photolithography technique. Si ions are implanted through the openings at an accelerated energy of 180 keV and a dose of $5 \times 10^{13}$ ions/cm$^2$, to form electrode layers corresponding to the openings in the substrate. After the resist pattern including the SiOx layer is removed, a proper pretreatment is performed again on the surface of the substrate, and another SiOx layer is deposited by chemical vapor deposition. An opening is formed on the desired portion of the substrate through the SiOx layer by using a photolithography technique. Si ions are implanted through the opening at an accelerated energy of 100 keV and a dose of $3 \times 10^{-12}$ ions/cm$^2$, to form an active layer just under the opening in the substrate. Then, the resist pattern including the SiOx layer is removed. Thereafter, a capless annealing process is performed in an arsenic atmosphere at 850° for 15 minutes and the implanted Si ions are electrically activated. Finally, gate, source, and drain electrodes are formed on the substrate by a lift-off method.

As described above, it is known that a GaAs base material used in a GaAs MESFET obtained by conventionally-known manufacturing steps normally contains boron and carbon atoms, and the activation ratio of the implanted Si ions during a capless annealing process after an active layer is formed depends upon the concentrations of boron and carbon ions. For this reason, it has been attempted to reduce the concentrations of residual impurities such as boron and carbon ions. However, it is known that when the total concentration of boron and carbon ions contained in the base material is about $2 \times 10^{17}$ atoms/cm$^3$ or less, the drain current-drain voltage (ID-VD) characteristic curve of the manufactured GaAs MESFET represents a nonlinear operation, as shown at a point A in FIG. 1, at a predetermined voltage value, e.g., 3 V or more and a drain current value of 100 μAM or more. It is considered that these nonlinear characteristics are caused because the interface between the active layer formed by implantation of Si ions and the base material in contact with the active layer is not clear but is blurred, and a depth profile is formed loosely extending downward from the portion near the lower end of the active layer. More specifically, conventional GaAs MESFET, if the drain voltage VD is increased, a leakage current flowing through a portion other than the active layer and the electrode layer formed in the substrate, in particular, a current flowing through the above-mentioned blurred portion starts oscillating at or above a predetermined threshold value. It is considered that because this current serves as a gate, the above-mentioned nonlinear characteristics are generated. The nonlinear operation of the drain current adversely affects the noise characteristics of the GaAs MESFET. In addition, it is confirmed that the above problem is similarly posed on a GaAs MESFET manufactured by forming an epitaxial layer on a base material.

As a means for solving the above problem, it has been already disclosed that high-concentration Cr ions serving as an impurity doped in a substrate can prevent the above-mentioned nonlinear operation, in "IEEE Transaction on Electron Devices., Vol. ED-34, No. 6, Jun. 1987, pp. 1239-1244". However, in this disclosed technique, the problem of a large change in drain current ID over time is also pointed out.

SUMMARY OF THE INVENTION

The present invention has been made in consideration of the above situation, and has as its object to provide a semiconductor device constituting a GaAs MESFET having advantages such as, e.g., a nonlinear operation can be suppressed and a change in drain current does not occur over a period of time.

In order to achieve the above object, a semiconductor device constituting a GaAs MESFET according to the present invention, comprises: a GaAs substrate prepared from a base material containing boron and carbon ions as impurities having a total impurity concentration of $2 \times 10^{17}$ atoms/cm$^3$ or more; electrode layers formed on predetermined portions of the GaAs substrate; an active layer formed adjacent to the electrode layers on the GaAs substrate by ion implantation; and source and drain electrodes formed on the electrode layers, respectively, and a gate electrode formed on the active layer. With the above arrangement, i.e., with a semiconductor device constituting a GaAs MESFET using, as a base material, a GaAs substrate containing boron and/or carbon ions at a total concentration of $2 \times 10^{17}$ atoms/cm$^3$ or more, there is provided a semiconductor device having advantages such as, e.g., a nonlinear operation can be suppressed and a change in drain current does not occur over a period of time.

DETAILED DESCRIPTION OF THE PREFERRED EMBODIMENTS

An embodiment of a semiconductor device according to the present invention will be described below with reference to FIGS. 2A to 2C and FIG. 3.

Figure 2A:
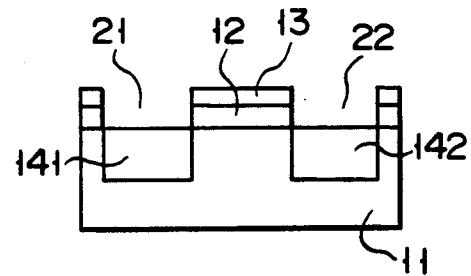
FIGS. 2A, 2B and 2C are sectional views showing an embodiment of steps in manufacturing a semiconductor device according to the present invention.
Figure 1:
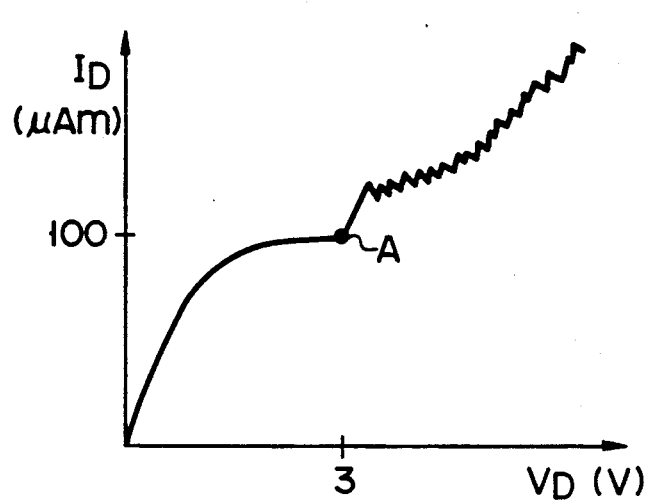
FIG. 1 is a graph showing drain current-drain voltage characteristics of a GaAs MESFET manufactured when the total concentration of impurities included in a base material is a conventional value.
Figure 2B:
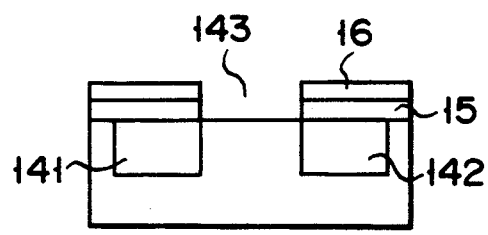
Figure 2C:
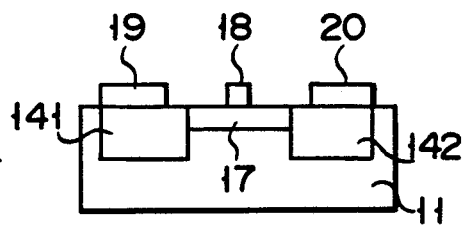

As shown in FIG. 2A, a base material containing boron and carbon ions at a total impurity concentration of $2 \times 10^{17}$ atoms/cm$^3$ is used for a GaAs substrate 11. After a proper pretreatment is performed on the GaAs substrate 11, an SiOx layer 12 having a thickness of, e.g., 5,000 Å is deposited on the substrate by chemical vapor deposition. Openings 21 and 22 are formed on desired portions of the substrate, through the SiOx layer, using resist pattern 13, by photolithography. Si ions are implanted in the openings 21 and 22 at an accelerated energy of 180 keV and a dose of $5 \times 10^{13}$ ions/cm$^2$ to form electrode layers 141 and 142. Then, as shown in FIG. 2B, the SiOx layer 12 and the resist pattern 13 are removed. Thereafter, a pretreatment is performed again on the surface of the GaAs substrate 11, and an SiOx layer 15 having a thickness of, e.g., 5,000 Å is deposited on the substrate by chemical vapor deposition. In addition, an opening 143 is formed on the GaAs substrate 11, through the SiOx layer 15, using resist pattern 16, by photolithography. Si ions are implanted through the opening 143 at an accelerated energy of 100 keV and a dose of $3 \times 10^{-12}$ ions/cm$^2$ to form an active layer 17 in the GaAs substrate between the electrode layers 141 and 142, as shown in FIG. 2C. After the electrode layers 141 and 142, and the active layer 17 are formed, a capless annealing process is performed in an arsenic atmosphere at 850° for 15 minutes to electrically activate these ion-implanted layers. Thereafter, a source electrode 19 is formed on the electrode layer 141, a drain electrode 20 is formed on the electrode layer 142, and a gate electrode 18 is formed on the active layer 17, by a lift-off method.

Figure 3:
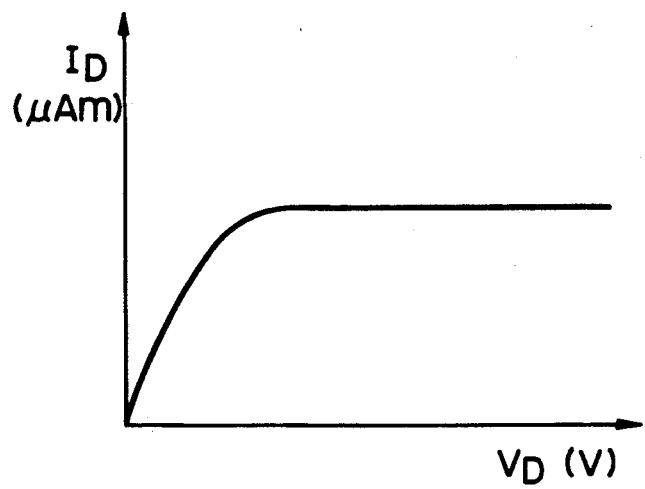
FIG. 3 is a graph showing drain current-drain voltage characteristics of the semiconductor device of the present invention.

In the semiconductor device constituting a GaAs MESFET of the present invention manufactured as described above, a base material containing boron and carbon ions for serving as an acceptor at a total impurity concentration of $2 \times 10^{17}$ atoms/cm$^3$ or more is used for the GaAs substrate 11. Thus, the boron and carbon ions cancel the Si ions serving as a donor forming the active layer 17. As a result, the blur of the lower end of the active layer 17 is eliminated, and the interface between the active layer 17 and the GaAs substrate 11 is rendered clear, thus suppressing a nonlinear operation, as shown in FIG. 3.

In the above embodiment, an example wherein a base material contains boron and carbon ions as impurities is exemplified, and the impurity concentration is represented as a total concentration of those ions. However, when the impurity concentration of only boron or carbon ions is $2 \times 10^{17}$ atoms/cm$^3$ or more, the same effect can be obtained as in the above embodiment. As a result, a nonlinear operation of the GaAs MESFET can be suppressed and a change in drain current does not occur over time.

What is claimed is:

1. A semiconductor device comprising:
   a GaAs substrate prepared from a base material containing exclusively carbon ions as an impurity, having an impurity concentration of more than $2 \times 10^{17}$ atoms/cm$^3$;
   electrode layers on predetermined portions of said GaAs substrate;
   an active layer formed adjacent to said electrode layers on said GaAs substrate by ion implantation; and
   source and drain electrodes respectively on said electrode layers, and a gate electrode on said active layer.

2. A semiconductor device according to claim 1, wherein said GaAs substrate has an impurity concentration of less than $10^{18}$ atoms/cm$^3$.

* * * * *